(12) United States Patent  
Halberstadt

(10) Patent No.: US 8,199,534 B2
(45) Date of Patent: Jun. 12, 2012

(54) LOAD CURRENT DETECTION IN ELECTRICAL POWER CONVERTERS

(75) Inventor: Hans Halberstadt, Groesbeek (NL)

(73) Assignee: NXP B.V., Eindhoven (NL)

( * ) Notice: Subject to any disclaimer, the term of this patent is extended or adjusted under 35 U.S.C. 154(b) by 419 days.

(21) Appl. No.: 12/527,640

(22) PCT Filed: Feb. 25, 2008

(86) PCT No.: PCT/IB2008/050665

§ 371 (c)(1),
(2), (4) Date: Aug. 18, 2009

(87) PCT Pub. No.: WO2008/104919

PCT Pub. Date: Sep. 4, 2008

(65) Prior Publication Data

US 2010/0085782 A1    Apr. 8, 2010

(30) Foreign Application Priority Data

Feb. 27, 2007 (EP) .................................. 07103092
Jun. 5, 2007 (EP) .................................. 07109636

(51) Int. Cl.
H02M 3/335 (2006.01)

(52) U.S. Cl. .................................. 363/21.02; 363/131

(58) Field of Classification Search .................... 363/16, 363/20, 21.01, 21.02, 21.03, 56.01, 131
See application file for complete search history.

(56) References Cited

U.S. PATENT DOCUMENTS

| 4,841,236 A * | 6/1989 | Miljanic et al. ................ 324/127 |
|---|---|---|
| 5,068,776 A | 11/1991 | Polivka |
| 5,304,917 A | 4/1994 | Somerville |
| 5,345,169 A | 9/1994 | Etter |
| 6,018,467 A | 1/2000 | Majid et al. |
| 6,087,782 A | 7/2000 | Majid et al. |
| 6,154,375 A | 11/2000 | Majid et al. |
| 6,366,484 B1 | 4/2002 | Jin |
| 7,511,385 B2 * | 3/2009 | Jones et al. ................ 290/43 |
| 7,692,321 B2 * | 4/2010 | Jones et al. ................ 290/43 |
| 7,738,266 B2 * | 6/2010 | Jacques et al. ............. 363/21.02 |
| 7,751,208 B2 * | 7/2010 | Jacques et al. ............. 363/21.02 |
| 7,755,209 B2 * | 7/2010 | Jones et al. ................ 290/44 |
| 7,830,130 B2 * | 11/2010 | Jacques et al. ............. 323/282 |
| 7,961,484 B2 * | 6/2011 | Lalithambika et al. ..... 363/56.09 |
| 2005/0073862 A1 | 4/2005 | Mednik et al. |

FOREIGN PATENT DOCUMENTS

| DE | 10 2005 047548 A1 | 2/2007 |
|---|---|---|
| WO | 0118946 A | 3/2001 |
| WO | 2004112229 A | 12/2004 |

* cited by examiner

*Primary Examiner* — Adolf Berhane

(57) ABSTRACT

A resonant converter comprises switching circuitry (1) for supplying pulses, at a controllable frequency, to a resonant circuit so as to power the primary circuit (3, 12) of a transformer (4). The secondary winding (5a, 5b) of the transformer (4) delivers an AC signal which is rectified and then produces a load current. On the primary side, the converter has a resistor (13) for deriving a first electrical signal representative of the current in the primary circuit (3, 12), and an auxiliary winding (14) which is closely coupled to the secondary winding (5a, 5b) and across which an auxiliary voltage is induced as a consequence of the close coupling of the winding (14) to the secondary winding (5a, 5b). A resistor/capacitor combination (16, 17) integrates the auxiliary voltage with respect to time to derive a second electrical signal. Computational circuitry (19) combines the first and second signals so as effectively to subtract the second signal from the first signal to derive a difference signal which is representative of the load current reflected onto the primary side of the transformer (4) and is accordingly representative of the actual load current.

20 Claims, 5 Drawing Sheets

First embodiment of the invention

First embodiment of the invention

Figure 1:
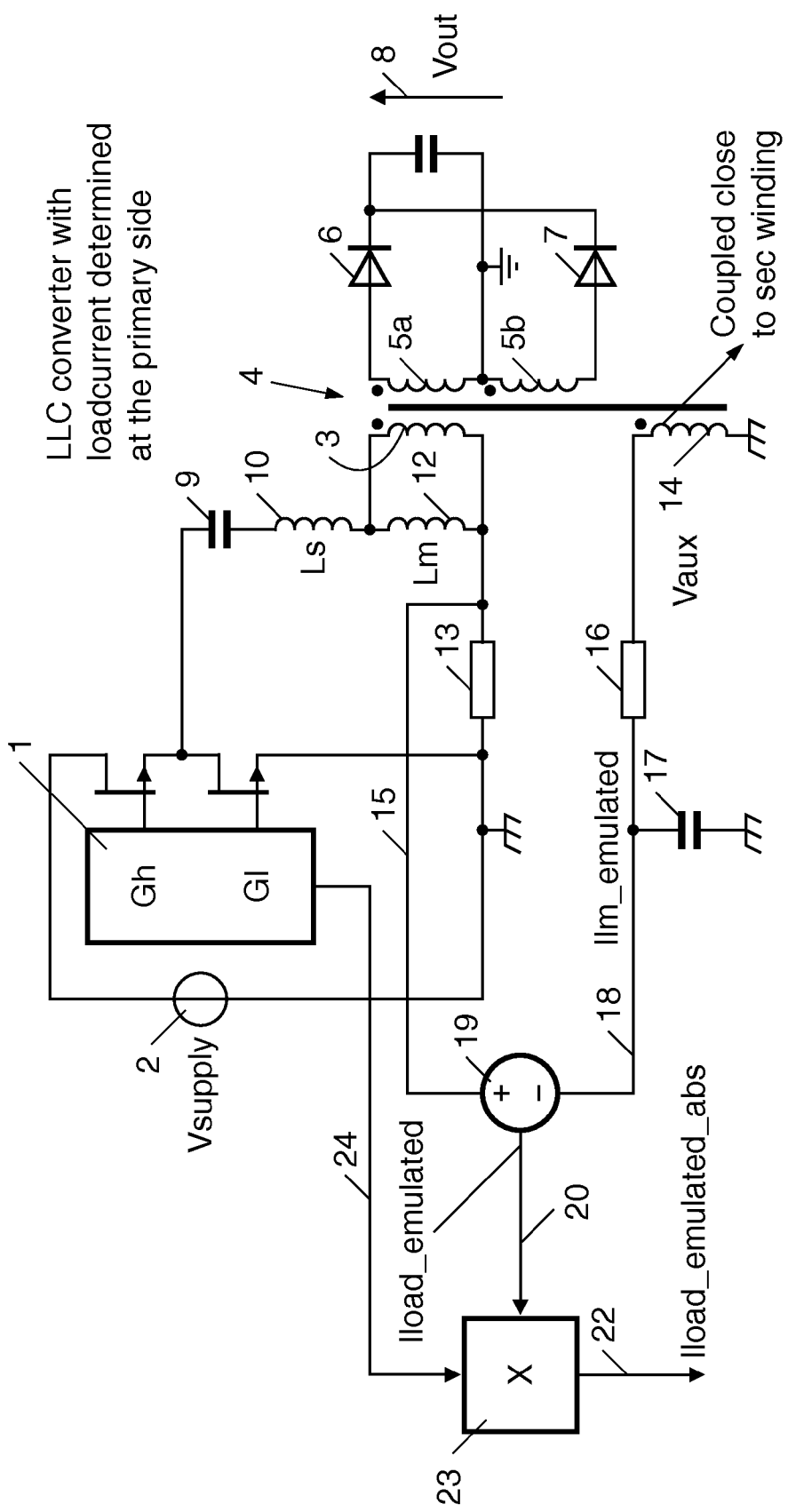

Additional embodiment of the invention, using addition and offset compensation

LOAD CURRENT DETECTION IN ELECTRICAL POWER CONVERTERS

This invention relates to the detection of load currents in electrical power converters, particularly resonant converters.

In a known frequency-controlled resonant converter, switching circuitry powers the primary winding of a transformer through a resonant circuit. The to secondary winding of the transformer delivers a load current, usually after rectification. Maximum load current is limited by increasing the switching frequency in such a way that the load current is reduced or limited to a safe value. This system requires extra circuitry at the secondary side of the transformer. On start-up of the converter, the switching frequency commences at a high value and then slowly decreases in order to prevent large load currents flowing during start-up. It is desirable for the start-up time to be as short as possible. The invention aims to provide an electrical power converter, particularly a resonant converter, which enables the load current to be detected on the primary side of the transformer, avoiding the need for extra circuitry on the secondary side, and also reducing start-up time.

The invention is directed at an electrical power converter comprising a transformer having a primary circuit and a secondary circuit, the primary circuit being energisable by an AC signal to induce a secondary AC signal across the secondary circuit for delivering a load current, wherein the converter has detecting circuitry for deriving an electrical signal representative of the load current. According to the invention, the detecting circuitry comprises a circuit element for deriving a first electrical signal representative of the current in the primary circuit, auxiliary circuitry for deriving a second electrical signal representative of the magnetising current flowing in the transformer and computational circuitry for combining the first and second signals so as effectively to subtract the second signal from the first signal to derive a difference signal which is representative of the load current reflected onto the primary side of the transformer and is accordingly representative of the actual load current.

The detection of the first and second signals, and the computation in the computational circuitry, may be performed in any convenient manner. For example, if the first and second signals are represented by +A and +B, the subtraction in the positive sense (i.e. along a positive axis) will result in the different signal A-B. Alternatively, if the subtraction is carried out in a negative sense (i.e. along a negative axis) the different signal will be −A+B. Further, if the signal B is detected with reversed polarity, i.e. −B, then the computational circuitry will add or sum the to two signals. In all cases, the important factor is that the different signal is representative of the load current.

Thus, the computational circuitry may either subtract the second signal from the first signal or may add the first signal to a reversal polarity value of the second signal.

The actual or absolute value of the load current can be obtained by appropriate processing of the difference signal, preferred processing being rectification or obtaining the modulus of the difference signal. In this way, the variation of the load current with time is obtainable on the primary side of the converter, providing reliable protection against excess load current. Also, the magnitude of the difference signal and the signal representing the absolute value of the load current are, being on the primary side, generally much lower than the actual load currents on the secondary side, resulting in easier current measurement on the primary side and lower power dissipation.

In the preferred embodiment to be described, the power converter is a resonant converter and comprises first converter circuitry for converting a DC input into the AC signal and also comprises second converter circuitry for converting the secondary AC signal into a DC output voltage for delivering the load current.

The circuit element is preferably a resistor in series with the primary circuit of the transformer, and the auxiliary circuitry is preferably represented by an auxiliary winding which is closely coupled to a secondary winding of the secondary circuit and across which an auxiliary voltage is induced as a consequence of the close coupling to the secondary winding, with an integrating circuit for integrating the auxiliary voltage with respect to time to derive the second electrical signal. The integrating circuitry preferably comprises a resistor/capacitor combination, but it is also possible to use an inductor as the integrator, or an operational amplifier with a resistor/capacitor combination.

According to another aspect of the invention there is provided a method of deriving an electrical signal representative of load current produced by an electrical power converter having a transformer with a primary circuit and a secondary circuit, the method comprising deriving a first electrical signal representative of the current in the primary circuit, deriving a second electrical signal representative of the to magnetising current flowing in the transformer and combining the first and second signals to derive a difference signal which is representative of the load current reflected onto the primary side of the transformer and is accordingly representative of the actual load current.

Preferably, the difference signal is representative of the variation of load is current as a function of time, enabling monitoring and control of the load current to be achieved by reference to the difference signal on the primary side of the converter.

Five resonant converters forming preferred embodiments of the invention will now be described, by way of example, with reference to the accompanying drawings in which FIGS. 1 to 5 are respectively electrical circuit diagrams of the five converters.

Referring to FIG. 1, the first resonant converter comprises first converter circuitry 1 for converting a DC input 2 (marked V supply) into an AC signal which energises the primary winding 3 of a transformer 4. The induced secondary AC signal across the split secondary winding 5a, 5b of the transformer 4 is rectified by second converter circuitry, including two diodes 6 and 7, into a DC output voltage 8 (marked V out) for delivering a load current.

The first converter circuitry 1 produces rectangular profile pulses Gh and Gl in alternate sequence at a controlled frequency. The pulses are fed to a resonant circuit consisting of a capacitor 9, series leakage inductance 10 and magnetising inductance 12 carrying the magnetising current. The transformer 4 is represented as an ideal transformer with a turns ratio of N:1:1, being the ratio of turns of the primary winding 3, one half 5a of the split secondary winding and the other half 5b of the split secondary winding. The primary winding 3 and the magnetising inductance 12 are shown in parallel, this parallel arrangement carrying the primary current and being in series with the leakage inductance 10 and the capacitor 9.

In accordance with the invention, the resonant converter has detecting circuitry comprising a resistor 13 in series with the primary circuit formed by the parallel network 3 and 12, and an auxiliary winding 14 closely coupled to the to secondary winding 5a, 5b of the transformer 4. The voltage across the resistor 13, and therefore the voltage on the electrical tapping 15, is proportional to the current in the primary circuit. The voltage across the auxiliary winding 14 is integrated with respect to time by an integrating circuit comprising a resistor 16 and capacitor 17, such that the voltage on the connection 18 is representative of the magnetising is current flowing in the transformer. The two voltages on the respective connections 15 and 18 are fed to a computational circuitry 19 which subtracts the voltage on the connection 18 from the voltage on the connection 15 to derive a difference signal which is delivered on connection 20 and is representative of the load current reflected onto the primary side of the transformer 4. Thus, the signal on connection 20 simulates the load current, this signal varying in time as the load current varies. The actual or absolute value of the load current is produced on output 22 by synchronous rectification, indicated at 23, by means of a connection 24 using the timing of the switching circuitry 1 which produces the series of pulses Gh and GI at a controllable frequency.

Figure 2:
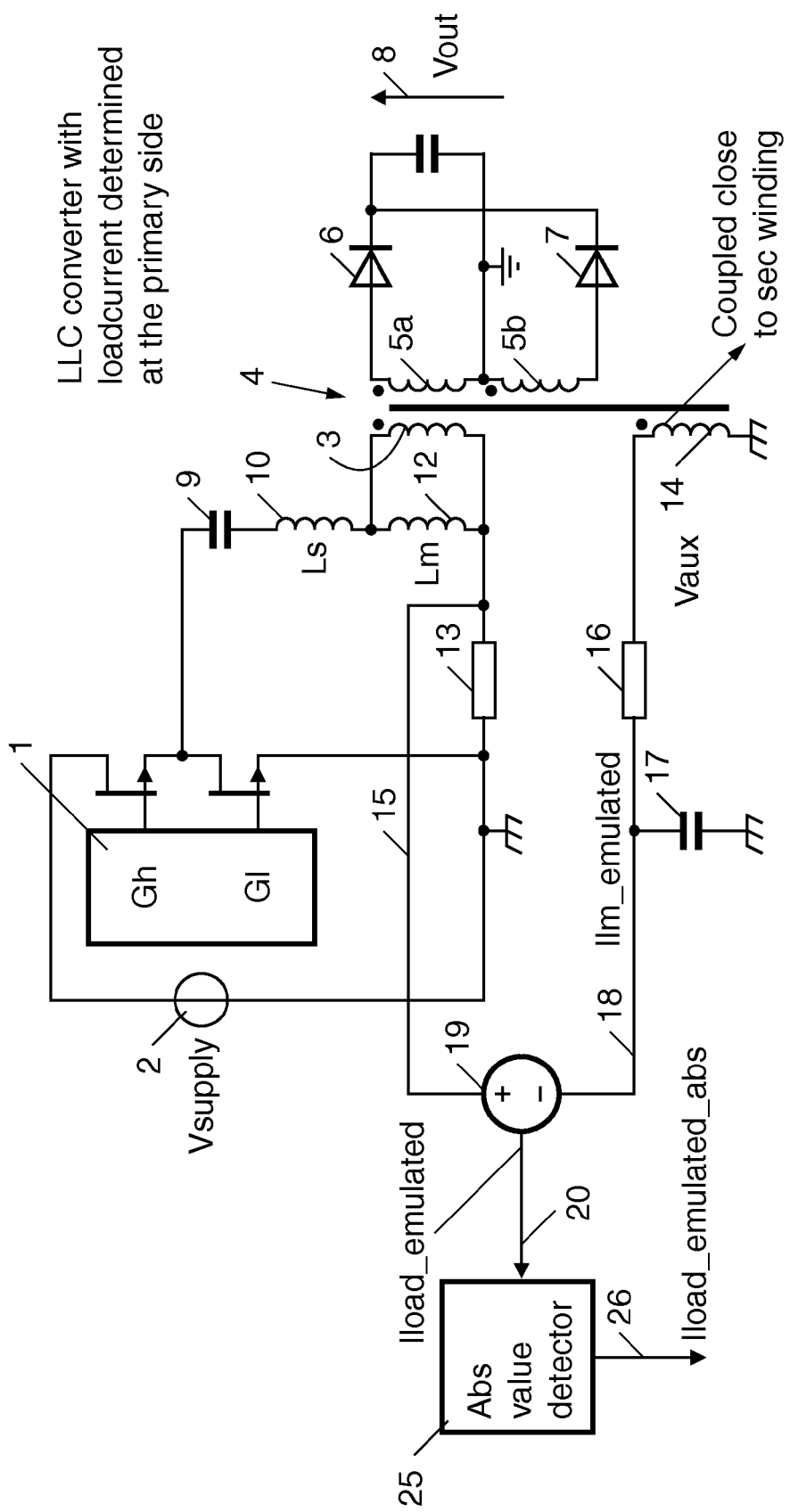
Figure 3:
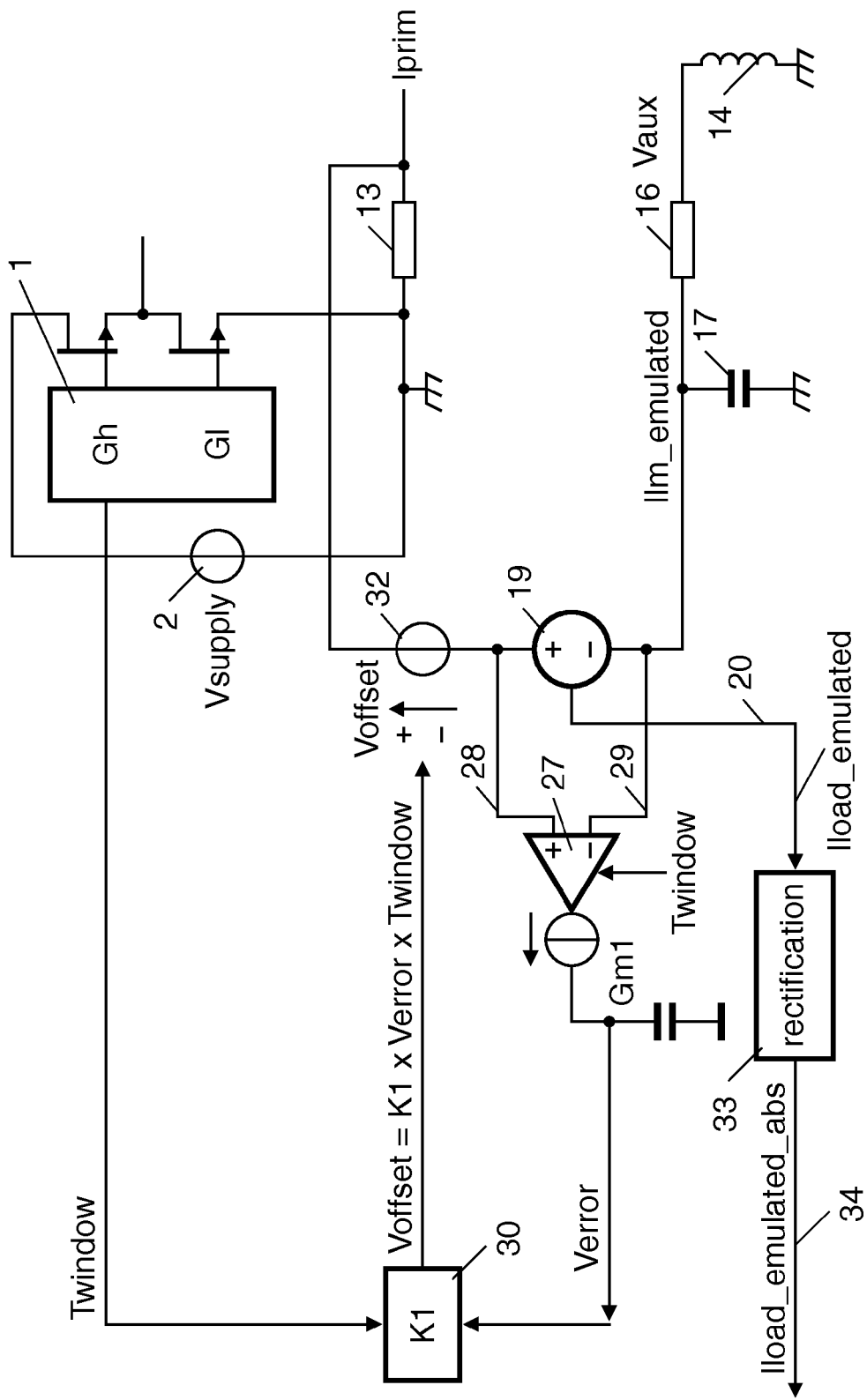

In the embodiments of FIGS. 2 and 3, parts corresponding to those of FIG. 1 bear the same reference numerals.

Referring to FIG. 2, the difference signal on the output 20 from the computational circuitry 19 is fed to an absolute value detector 25 which derives the modulus of the signal from the comparator 19 in order to provide an absolute value of the load current on output 26.

FIG. 3 is a partial circuit diagram of the third embodiment, the components to the right of the circuit 1 and the auxiliary winding 14 being omitted but being identical with those of FIGS. 1 and 2.

The embodiment of FIG. 3 has compensating circuitry which compensates for a DC current component in the inductance 12, which can arise with duty cycles different from 50% or if the transformer has slight asymmetry between its primary and secondary windings. The integrated voltage across the auxiliary winding 14 cannot compensate for this DC current component. Instead, the compensating circuitry employs a differential amplifier 27 to generate an error signal (V error) to based on the difference between the primary current on connection 28 and the simulated magnetising current on connection 29, during a time window (T window) when the load current is zero or close to zero. During this time interval the difference between the simulated primary current and the simulated magnetising current should be zero. Any error signal from the output of the differential amplifier 27 is is scaled by a factor K1 in a multiplier 30 to generate an offset signal (V offset) which is fed back to an offset compensating source 32 which modifies the signal representative of primary winding current in order to compensate for the DC current component in the inductance 12. Alternatively, the offset source may modify the signal representative of the magnetising current. The difference signal from the computational circuitry 19 is rectified by a rectifier 33 to provide the absolute value of load current on an output 34. The rectifier function can be provided by an absolute value detector or synchronous rectifier, according to FIGS. 1 and 2.

In a further embodiment (not illustrated) the signal simulating the magnetising current is scaled by a factor that is adaptively determined by measuring the difference between the actual primary current and the simulated load current during an interval when the load current is close to zero. In this case, the simulated load current and the primary current should be equal. This enables the scaling factor to be set. The signal simulating the magnetising current is scaled by a factor that is adaptively determined by measuring both primary current and simulated magnetising current and generating an error signal derived from both signals, or from both signals in combination with the timing signals of the switching circuitry 1, or from both signals in combination with the conduction times of the secondary diodes, or an error signal generating by a combination of those.

Figure 4:
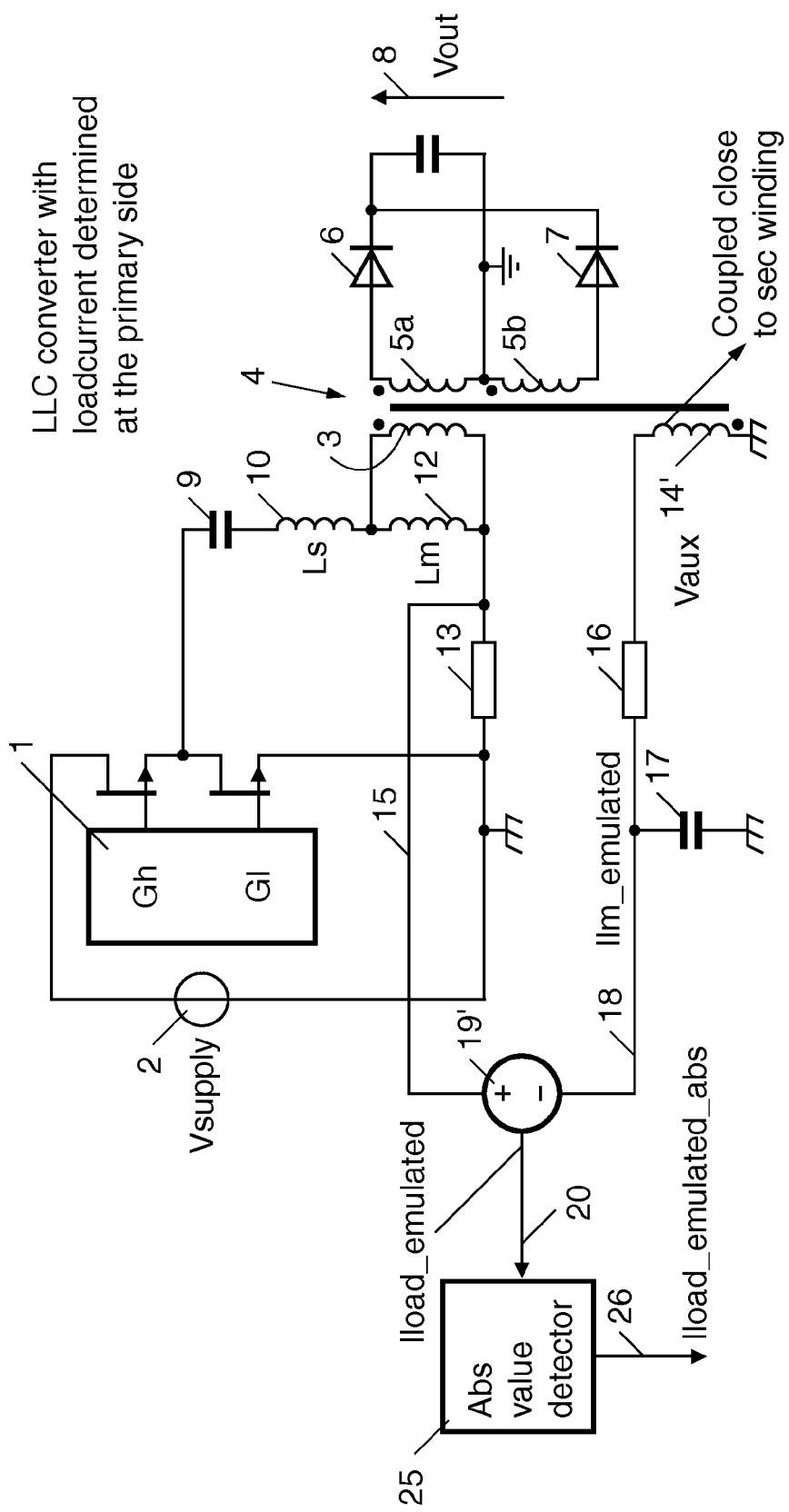

The embodiment of FIG. 4 is a modification of that of FIG. 2 and corresponding parts bear the same reference numerals. The auxiliary winding 14' in FIG. 4 is connected in the reverse sense in relation to the winding 14 of FIG. 2, so the polarity of the voltage across the winding 14' is opposite to the polarity of the voltage across the winding 14 of FIG. 2. After integration of the voltage across the winding 14' (by means of the resistor 16 and capacitor 17), the voltage on the connection 18 has a magnitude representative of the magnetising current flowing in to the transformer, but with a negative polarity. The computational circuitry 19' adds the voltage on the connection 18 to the voltage on the connection 15 to derive the difference signal which is delivered on connection 20 and is representative of the load current reflected onto the primary side of the transformer 4.

Figure 5:
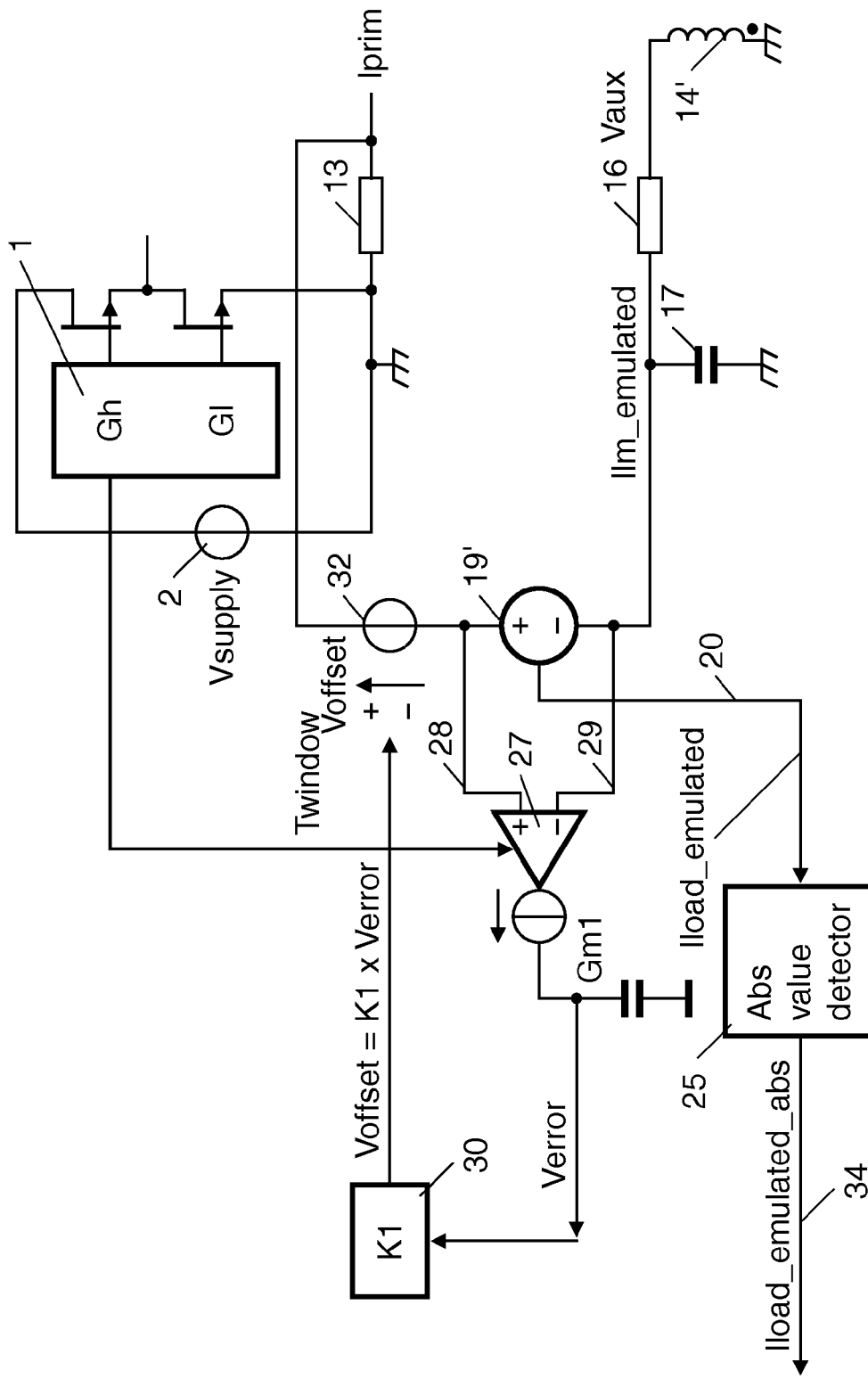

The embodiment of FIG. 5 is a modification of that of FIG. 3 and is corresponding parts bear the same reference numerals. In common with FIG. 4, the auxiliary winding 14' of FIG. 5 is connected in the reverse sense so the polarity of the voltage across the winding 14' of FIG. 5 is opposite to the polarity of the voltage across the winding 14 of FIG. 3. The computational circuitry 19' of FIG. 5 thus adds or sums the signals on its inputs to derive the difference signal on the output 20 which is then processed by an absolute value detector 25 to provide the absolute value of load current on the output 34. Due to the addition in the computational circuitry 19' by using a virtual ground AC coupling can be used which gives the advantage that the offset voltage of the amplifier itself is not important.

The signal simulating the magnetising current is scaled by a factor that is adaptively determined by measuring both primary current and simulated magnetising current and generating an error signal derived from both signals, or from both signals in combination with the timing signals of the switching circuitry 1, or from both signals in combination with the conduction times of the secondary diodes, or an error signal generating by a combination of those.

Each embodiment of resonant converter obtains, on the primary side, a time-varying signal representative of the load current, so that the frequency of the switching circuitry 1 can be controlled to limit the load current, both during start-up and normal operation. Also, the output power of the converter can be measured and the timing of the calculation interval of the secondary diodes can be determined.

As alternative to using the resistor 13 as the current sensor, the capacitor 9 may be split between V supply and ground and placed at the other side of the inductance 12, a current sensing resistor then being placed in series with the capacitor that is connected to ground. Also, a third smaller capacitor with a current sensing resistor in series can be added to the split node.

Instead of using a transformer with split windings 5a and 5b a secondary winding with a bridge rectifier can be employed. Also, the diodes 6, 7 or bridge rectifier could be replaced by active switches.

From reading the present disclosure, other variations and modifications will be apparent to persons skilled in the art. Such variations and modifications may involve equivalent and other features which are already known in the art, and which may be used instead of or in addition to features already described herein.

Although Claims have been formulated in this Application to particular combinations of features, it should be understood that the scope of the disclosure of the present invention also includes any novel feature or any novel combination of features disclosed herein either explicitly or implicitly or any generalisation thereof, whether or not it relates to the same invention as presently claimed in any Claim and whether or not it mitigates any or all of the same technical problems as does the present invention.

Features which are described in the context of separate embodiments may also be provided in combination in a single embodiment. Conversely, various features which are, for brevity, described in the context of a single embodiment, may also be provided separately or in any suitable subcombination. The Applicants hereby give notice that new Claims may be formulated to such features and/or combinations of such features during the prosecution of the present Application or of any further Application derived therefrom.

The invention claimed is:

1. An electrical power converter comprising a transformer having a primary circuit and a secondary circuit, the primary circuit being energisable by an AC signal to induce a secondary AC signal across the secondary circuit for delivering a load current, wherein the converter has detecting circuitry for deriving an electrical signal representative of the load current, wherein the detecting circuitry comprises a circuit element for deriving a first electrical signal representative of the current in the primary circuit, auxiliary circuitry for deriving a second electrical signal representative of the magnetising current flowing in the transformer and computational circuitry for combining the first and second signals so as effectively to subtract the second signal from the first signal to derive a difference signal which is representative of the load current reflected onto the primary side of the transformer and is accordingly representative of the actual load current, wherein the auxiliary circuitry comprises an auxiliary winding which is closely coupled to a secondary winding of the secondary circuit and across which an auxiliary voltage is induced as a consequence of the close coupling to the secondary winding, and integrating circuitry for integrating the auxiliary voltage with respect to time to derive the second electrical signal.

2. A converter according to claim 1, wherein the computational circuitry is arranged to either subtract the second signal from the first signal, or add the first signal to a reversed polarity value of the second signal.

3. A converter according to claim 1, wherein the converter comprises first converter circuitry for converting a DC input into the AC signal to energise the primary circuit.

4. A converter according to claim 3, wherein the converter also comprises second converter circuitry for converting the secondary AC signal into a DC output voltage for delivering the load current.

5. A converter according to claim 1, wherein the circuit element is a resistor in series with the primary circuit of the transformer.

6. A converter according to claim 1, wherein the integrating circuitry comprises a resistor/capacitor combination.

7. A converter according to claim 1 and including a synchronous rectifier for rectifying the difference signal to derive the signal representative of the actual load current.

8. A converter according to claim 1 and including an absolute value detector for deriving the modulus of the difference signal to derive the signal representative of the actual load current.

9. A converter according to claim 1 and including compensating circuitry for compensating for a DC current component in a magnetising inductance of the transformer.

10. A converter according to claim 9, wherein the compensating circuitry is operable to generate an error signal, based on the difference between the first signal and the second signal, during a time window when the load current is at or close to zero, the error signal being fed back to generate an offset signal to alter the magnitude of the first signal or the second signal fed to the computational circuitry.

11. A method of deriving an electrical signal representative of load current produced by an electrical power converter having a transformer with a primary circuit and a secondary circuit, the method comprising deriving a first electrical signal representative of the current in the primary circuit, deriving a second electrical signal representative of the magnetising current flowing in the transformer using an auxiliary circuitry comprising an auxiliary winding which is closely coupled to a secondary winding of the secondary circuit and across which an auxiliary voltage is induced as a consequence of the close coupling to the secondary winding, wherein the auxiliary voltage is integrated with respect to time to derive the second electrical signal, and combining the first and second signals to derive a difference signal which is representative of the load current reflected onto the primary side of the transformer and is accordingly representative of the actual load current.

12. A method according to claim 11, wherein the difference signal is representative of the variation of load current as a function of time.

13. The converter of claim 3, wherein the converter is a resonant converter, and wherein the AC signal is fed into a resonant circuit, which comprises a magnetising inductance of the primary circuit, a capacitor, and a second inductance coupled to the magnetising inductance and to the capacitor.

14. A resonant electrical power converter comprising a transformer having a primary circuit and a secondary circuit, the primary circuit being energisable by an AC signal to induce a secondary AC signal across the secondary circuit for delivering a load current, wherein the converter has detecting circuitry for deriving an electrical signal representative of the load current, wherein the detecting circuitry comprises a circuit element for deriving a first electrical signal representative of the current in the primary circuit, auxiliary circuitry for deriving a second electrical signal representative of the magnetising current flowing in the transformer, computational circuitry for combining the first and second signals so as effectively to subtract the second signal from the first signal to derive a difference signal which is representative of the load current reflected onto the primary side of the transformer and is accordingly representative of the actual load current, and compensating circuitry for compensating for a DC current component in a magnetising inductance of the transformer, wherein the compensating circuitry is operable to generate an error signal, based on the difference between the first signal and the second signal, during a time window when the load current is at or close to zero, the error signal being fed back to generate an offset signal to alter the magnitude of the first signal or the second signal fed to the computational circuitry.

15. A resonant converter according to claim 14, wherein the computational circuitry is arranged to either subtract the second signal from the first signal, or add the first signal to a reversed polarity value of the second signal.

16. A resonant converter according to claim 14, wherein the converter comprises first converter circuitry for converting a DC input into the AC signal to energise the primary circuit.

17. A resonant converter according to claim 16, wherein the AC signal is fed into a resonant circuit, which comprises a magnetising inductance of the primary circuit, a capacitor, and a second inductance coupled to the magnetising inductance and to the capacitor.

18. A resonant converter according to claim 16, wherein the converter also comprises second converter circuitry for converting the secondary AC signal into a DC output voltage for delivering the load current.

19. A resonant converter according to claim 14, wherein the circuit element is a resistor in series with the primary circuit of the transformer.

20. A resonant converter according to claim 14, wherein the auxiliary circuitry comprises an auxiliary winding which is closely coupled to a secondary winding of the secondary circuit and across which an auxiliary voltage is induced as a consequence of the close coupling to the secondary winding, and integrating circuitry for integrating the auxiliary voltage with respect to time to derive the second electrical signal.

* * * * *